(12) United States Patent
Golan (10) Patent No.: US 7,208,969 B2
(45) Date of Patent: Apr. 24, 2007

(54) OPTIMIZE PARALLEL TESTING (75) Inventor: Avi Golan, Tel Aviv (IL)

(73) Assignee: Optimaltest Ltd., Nes-Ziona (IL)

( * ) Notice: Subject to any disclaimer, the term of this patent is extended or adjusted under 35 U.S.C. 154(b) by 0 days.

(21) Appl. No.: 11/175,026

(22) Filed: Jul. 6, 2005

(65) Prior Publication Data
US 2007/0007981 A1    Jan. 11, 2007

(51) Int. Cl.
G01R 31/00 (2006.01)
G01R 31/26 (2006.01)
G06F 19/00 (2006.01)

(52) U.S. Cl. .................................. 324/765; 324/158.1
(58) Field of Classification Search .................... None
See application file for complete search history.

(56) References Cited

U.S. PATENT DOCUMENTS

| | | | |
|---|---|---|---|
| 4,639,664 A | 1/1987 | Chiu et al. | |
| 5,386,189 A * | 1/1995 | Nishimura et al. | 324/158.1 |
| 5,477,544 A | 12/1995 | Botelho | |
| 5,539,325 A | 7/1996 | Rostoker et al. | |
| 5,736,850 A * | 4/1998 | Legal | 324/158.1 |
| 6,246,250 B1 | 6/2001 | Doherty et al. | |
| 6,842,022 B2 | 1/2005 | Khoche | |
| 6,988,232 B2 | 1/2006 | Ricchetti et al. | |

* cited by examiner

*Primary Examiner*—Paresh Patel
(74) *Attorney, Agent, or Firm*—Browdy and Neimark, PLLC (57) ABSTRACT

Parallel dies testing, mostly implemented on memory ICs—Integrated Circuits, significantly reduced overall test time. In order to minimize the need for physical probing, wafer probe card technology to allow simultaneous probing, ATE—Automated Test Equipment with enough channels and CPU power to handle the parallel testing. While new devices are designed with enough channels, and probe cards are designed and manufactured for each new device, the need to purchase new ATE to benefit from the technology is a heavy burden on parallel testing. It is proposed to interpose a multiplexer between the probe card and the ATE accompanied by a system that optimizes tester resources. The proposed system will allow test houses to benefit most from their investment without paying the full penalty of keeping less capable ATE.

21 Claims, 7 Drawing Sheets

| 31<br>Test time=<br>2 min | 32<br>Test time=<br>1 min | 33<br>Test time=<br>2 min | 34<br>Test time=<br>7 min |
|---|---|---|---|
| 35<br>Test time=<br>2 min | 36<br>Test time=<br>5 min | 37<br>Test time=<br>1 min | 38<br>Test time=<br>2 min |
| 39<br>Test time=<br>3 min | 311<br>Test time=<br>2 min | 312<br>Test time=<br>1 min | 313<br>Test time=<br>2 min |
| 314<br>Test time=<br>5 min | 315<br>Test time=<br>2 min | 316<br>Test time=<br>4 min | 317<br>Test time=<br>2 min |

OPTIMIZE PARALLEL TESTING

FIELD OF THE INVENTION

The present invention is generally related to semiconductor IC testing and specifically to parallel testing optimization.

BACKGROUND OF INVENTION

Testing has emerged as a key constraint on the path to more advanced, reliable and cost effective semiconductor devices. Semiconductor process technology is characterized by Moore's Law, which states that the number of transistors in a given surface area will double every 18 months. This has enabled today's designers to pack high-volume production chips with 100 million transistors, straining test systems as more transistors and structures must be tested. This exponential growth rate requires continually increasing process, design and manufacturing complexities, which also drive the need for more test time and more comprehensive testing.

Currently, testing is performed in two basic configurations. Devices are either tested sequentially in a singular manner or several are tested at the same time in "parallel". Singular tests are more common with complex products such as CPUs while memory devices are more often tested in parallel.

Productivity gains are often realized when testing (and probing) more than one device in parallel. Virtually all memory testing is done in parallel, where it is common to test 64 or 128 devices simultaneously, both at wafer-sort and at packaged unit class-test. The move to parallel test within other product categories such as microprocessors, RF and mixed signal is already underway and accelerating.

The probing requirements for parallel test at wafer-sort drive the need for more and more probe contacts on the sort probe card, across an increasing fraction of the wafer area. Some believe that ultimately contacting the entire wafer is expected to be the industry standard.

Generally speaking, the parallel testing of devices at wafer-sort involves interfacing a tester (being, for example, ATE—Automated Test Equipment) to a probe card which is adapted to simultaneously probe multiple devices. The application of the probe card to devices to be tested is by means of "touchdown". A touchdown is typically an event where a probe card 'touches' with its needles the devices that are to be tested. Note that the probe card can support up to m tested devices (referred to also as m probe sites) simultaneously. Note also that the larger the value of m, the higher is the degree of parallelism. Note also that the term "probe sites" is not bound by any specific form of probe card and the means for contacting (e.g., touching) the probe to the device. Likewise this term is not bound by any form of touchdown and particularly not by the one described above.

In many cases, the computer-controlled equipment that tests electronic devices for functionality and performance is referred to as the ATE. The ATE includes control hardware, sensors, and software that perform testing and collect and analyze the test results. The ATE can support up to n test sites simultaneously. Each test site would typically contain a processing resource (one or more processors and associated m, the higher is the degree of parallelism. Note that the term "test sites" is not bound by any ATE and particularly not by ATE described above.

In order to increase parallelism: some constraints may apply:

1) The tester is adjusted and synchronized to utilize preferably maximum number of tester channels in parallel that are available to service the device I/Os, 2) The probe card is designed to meet the device specifications on one hand, and the parallelism specification on the other hand.

Note that in hitherto known testing methodologies, the parallelism of the tester and the probe card match, or, in other words m=n. Had this not been the case, the extra resources of the tester (in the case that n>m) or those of the probe card (in the case of m>n) would become redundant, since the number of the devices that can be tested in parallel is limited by the resources of the lesser of the two.

Each of the specified two requirements has a significant cost impact:

1) The tester cost soars with the increase in parallelism. As more devices are tested in parallel, more tester channels and power supplies are required, pushing up the hardware and other costs.

2) The cost of the probe card increases as the parallelism specification grows.

Nevertheless, parallel testing is eventually cheaper than singular testing, and more parallelism is in most cases cheaper than less parallelism. Increasing parallelism is a continuous effort in which all the factors are analyzed versus the current level of parallelism to determine the optimal ROI (Return On Investment) for a suggested parallelism increase.

The problem with existing parallel test methods is that the overall test time for a group of devices tested in parallel will be limited by the slowest tested device in the group. Probing cannot move on to the subsequent group of devices to be tested until all devices in the present touchdown are complete. Therefore, if one device takes 50% more test time than the remaining devices in the same touchdown, then the actual test time of all the devices (within the same touchdown) will be longer by 50%.

There is a need in the art to provide optimized parallel testing when the number of probe sites exceeds the number of test sites (m>n). There is still further need in the art to provide for a testing scheme in which the testing time of the slowest device will not prescribe the overall testing time.

There is still further need in the art to provide for a system and method facilitating parallel testing optimization using older generation ATE—Automatic Testing Equipment with later generation of probe card technology.

LIST OF RELATED ART

U.S. Pat. No. 5,477,544 discloses a multi-port tester interface coupled between an interface port tester having only one test port and a plurality of interface ports to be tested. The multi-port tester interface includes timing and control logic which provides an initialization signal to the interface port tester. The timing and control logic controls an interface port selector to provide an interface port address to a test signal multiplexer and an input multiplexer. A test signal from the interface port tester is transmitted to the appropriate interface port under test through the test signal multiplexer. A successful test completion signal is received by the appropriate input of the test completion multiplexer as selected by the address provided by the interface port selector, and provided to an input port of the interface port tester. Each interface port to be tested is thus sequentially yet automatically coupled to the interface port tester, and is sequentially tested without connecting and disconnecting individual interface ports from a tester. Appropriate reset and voltage level signal shifting circuitry is also provided.

U.S. Pat. No. 4,639,664 discloses an apparatus for testing a plurality of integrated circuit in parallel. In accordance with a broad aspect of the invention, a system is presented for parametrically and functionally testing integrated circuit devices in parallel. At least one integrated circuit device receiving channel is provided for defining a plurality of integrated circuit device test stations therealong, and means are provided for delivering parametric and functional test signals at least functionally in parallel to each of the integrated circuit device test stations. Means are provided at each test station for selectively engaging the integrated circuit devices to apply the parametric and functional test signals to the integrated circuit device at that station, and to selectively isolate the device from the test signals. Means are provided for receiving an output from each test location in response to the test signals, and means for determining from the output the parameters of each tested integrated circuit device. In accordance with the invention, means are provided for sorting the tested integrated circuit devices according to their measured or tested parameters.

SUMMARY OF THE INVENTION

In accordance with certain embodiments, the invention provides a method and system that addresses parallel tested dies individually, such that parallel and individual dies test optimization are achieved.

In accordance with certain embodiments, based on historical process information, on-the-fly measurements and statistical calculation, a system detects the parallel testing limitation and generates an alternative testing scheme that possibly addresses selected dies individually, reducing overall test time. This "breaking" of parallel testing limitation, paves the way to implement many "die tailored" test suites such as test suite based on wafer maps, parametric testing reduction etc. and allocation of tester resources per need.

Accordingly, the invention provides a method for testing a plurality of devices in parallel, comprising: a) allocating n test sites; b) allocating m connection sites, such that substantially $2*n \leq m$ and associating m devices of an object to the m probe sites; c) applying simultaneously a testing scheme to at most n devices from among the m devices.

The present invention further provides a system for testing a plurality of devices in parallel, comprising: a control capable of being coupled to a tester and multiplexer; the tester is configured to allocate testing resources of n test sites; the multiplexer is configured to be coupled to the tester and a connector means; the connector means is configured to allocate m connection sites, and to associate m devices of an object to the m probe sites, such that $2*n \leq m$; the control is further configured to allocate at most n devices from among the m devices to corresponding at most n connection sites, and applying simultaneously a testing scheme to the at most n devices.

Further provided by the present invention is a method for testing a plurality of devices in parallel, comprising: a) allocating n test sites; b) allocating m connection sites, such that substantially $2*n \leq m$ and associating m devices of an object to the m probe sites; c) applying simultaneously a testing scheme to at most n devices from among the m devices; the up to n devices constitute tested devices; d) repeatedly performing the following until all said m devices are tested: in response to termination of testing of a device, selecting for test at least one untested device from among the m devices by allocating thereto a respective vacant test site; said untested device is selected using a criterion for reducing the overall testing time of the m devices compared to overall time it would take to test the m devices using up to n connection sites.

In addition the present invention provides a computer program product having storage for storing computer code portions for performing at least the following: a) allocating n test sites; b) allocating m connection sites, such that substantially $2*n \leq m$ and associating m devices of an object to the m probe sites; c) applying simultaneously a testing scheme to at most n devices from among the m devices

BRIEF DESCRIPTION OF THE DRAWINGS

For a better understanding, the invention will now be described, by way of example only, with reference to the accompanying drawings, in which.

DETAILED DESCRIPTION OF THE INVENTION

Unless specifically stated otherwise, as apparent from the following discussions, it is appreciated that throughout the specification discussions, utilizing terms such as, "processing", "computing", "calculating", "determining", "managing", "controlling" and "executing" or the like, refer to the action and/or processes of a computer or computing system, or processor or similar electronic computing device, that manipulate and/or transform data represented as physical, such as electronic, quantities within the computing system's registers and/or memories into other data similarly represented as physical quantities within the computing system's memories, registers or other such information storage, transmission or display devices.

Embodiments of the present invention may use terms such as, processor, computer, apparatus, system, sub-system, module, unit and device (in single or plural form) for performing the operations herein. This may be specially constructed for the desired purposes, or it may comprise a general-purpose computer selectively activated or reconfigured by a computer program stored in the computer. Such a computer program may be stored in a computer readable storage medium, such as, but is not limited to, any type of disk including floppy disks, optical disks, CD-ROMs, magnetic-optical disks, read-only memories (ROMs), random access memories (RAMs) electrically programmable read-only memories (EPROMs), electrically erasable and programmable read only memories (EEPROMs), magnetic or optical cards, or any other type of media suitable for storing electronic instructions, and capable of being coupled to a computer system bus.

The processes/devices (or counterpart terms specified above) and displays presented herein are not inherently related to any particular computer or other apparatus. Various general-purpose systems may be used with programs in accordance with the teachings herein, or it may prove convenient to construct a more specialized apparatus to perform the desired method. The desired structure for a variety of these systems will appear from the description below. In addition, embodiments of the present invention are not described with reference to any particular programming language. It will be appreciated that a variety of programming languages may be used to implement the teachings of the inventions as described herein.

Note that the invention relates to testing IC devices (Devices Under Test—DUTs) of a tested object. In certain embodiments the tested object being a wafer and the IC device being a die. In accordance with certain other embodiments, the DUT being a packaged device, such as TSOP-1, TSOP-2, CSP (Chip Scale Package) and BGA (Ball Grid Array). In accordance with certain other embodiments, the DUT being a module stacked together to build a multi core system (constituting yet another example of DUT), e.g., a memory module accommodated in a processor device which is tested either in a die form or as a packaged device.

The invention is not bound by these examples.

For convenience, the description refers predominantly to dies and wafers, however, those versed in the art will readily appreciate the invention is likewise applicable to other DUTs and/or objects.

Note also that for convenience, the description refers predominantly to probe card and probe sites (associated with a tester), all as explained above in the background of the invention section. Those versed in the art will readily appreciate that the invention is by no means bound to probe cards and probe sites, and is applicable also to other forms of contacting means having associated contacting sites. Thus, in accordance with certain embodiments, in the case of packaged devices a so-called handler card is used for contacting plurality of handler sites in parallel. Insofar as the latter case is concerned, the invention refers to a situation that the number of test sites (n) is smaller than the number of handler sites (m). Bearing this in mind, it is noted that the invention provides in certain embodiment, a technique that deals with the way the individual dies within the parallel testing are optimally tested when n (the number of test sites prescribed by the ATE capability) is smaller then m (the number of probing sites).

Figure 1:
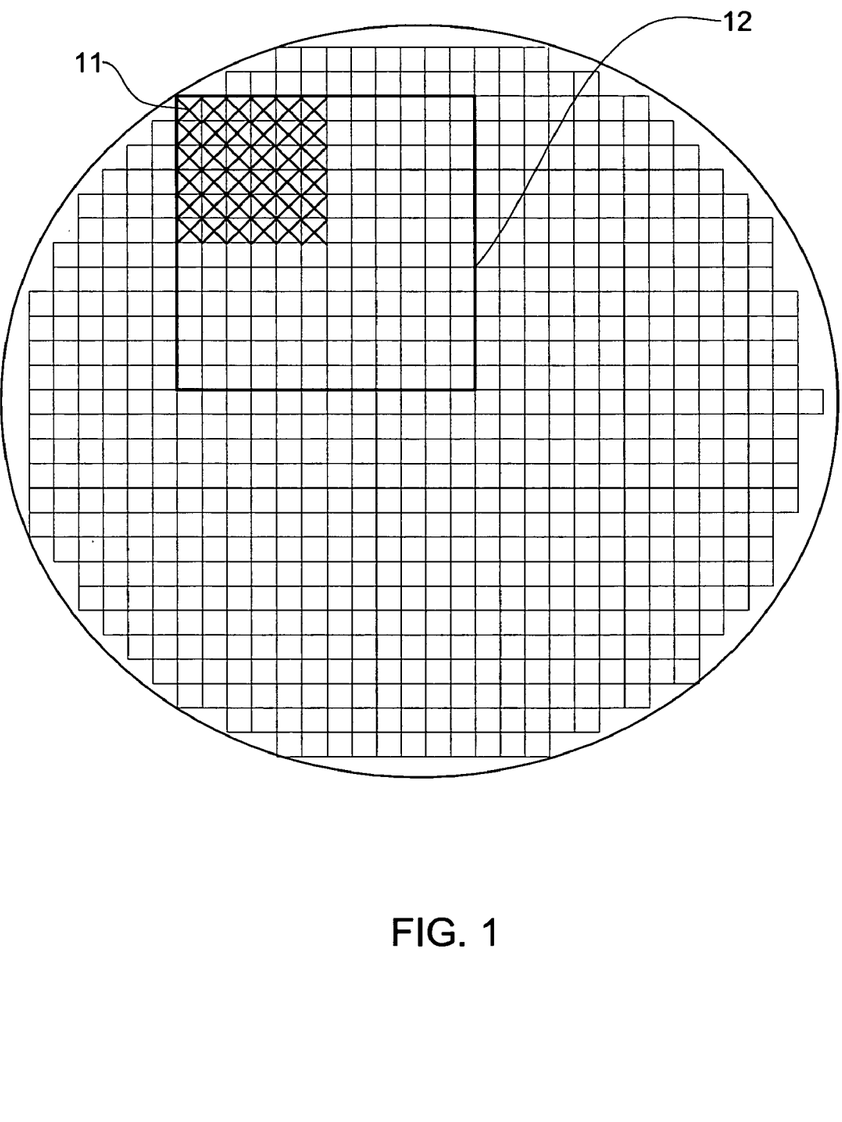
FIG. 1—is a schematic illustration of an exemplary parallel testing scheme, with 144 probe card sites and 36 testing sites.

An illustration of this parallel testing scheme is presented in FIG. 1. In this example, the tester is capable of testing 36 dies in parallel, or n=36 (11), while the probe card and the device technology allows probing of 144 dies in parallel, or m=144 (12).

The invention is, of course, not bound by this example. Thus by way of example, the probe card may allow probing of substantially all the dies in the wafer simultaneously.

Figure 2:
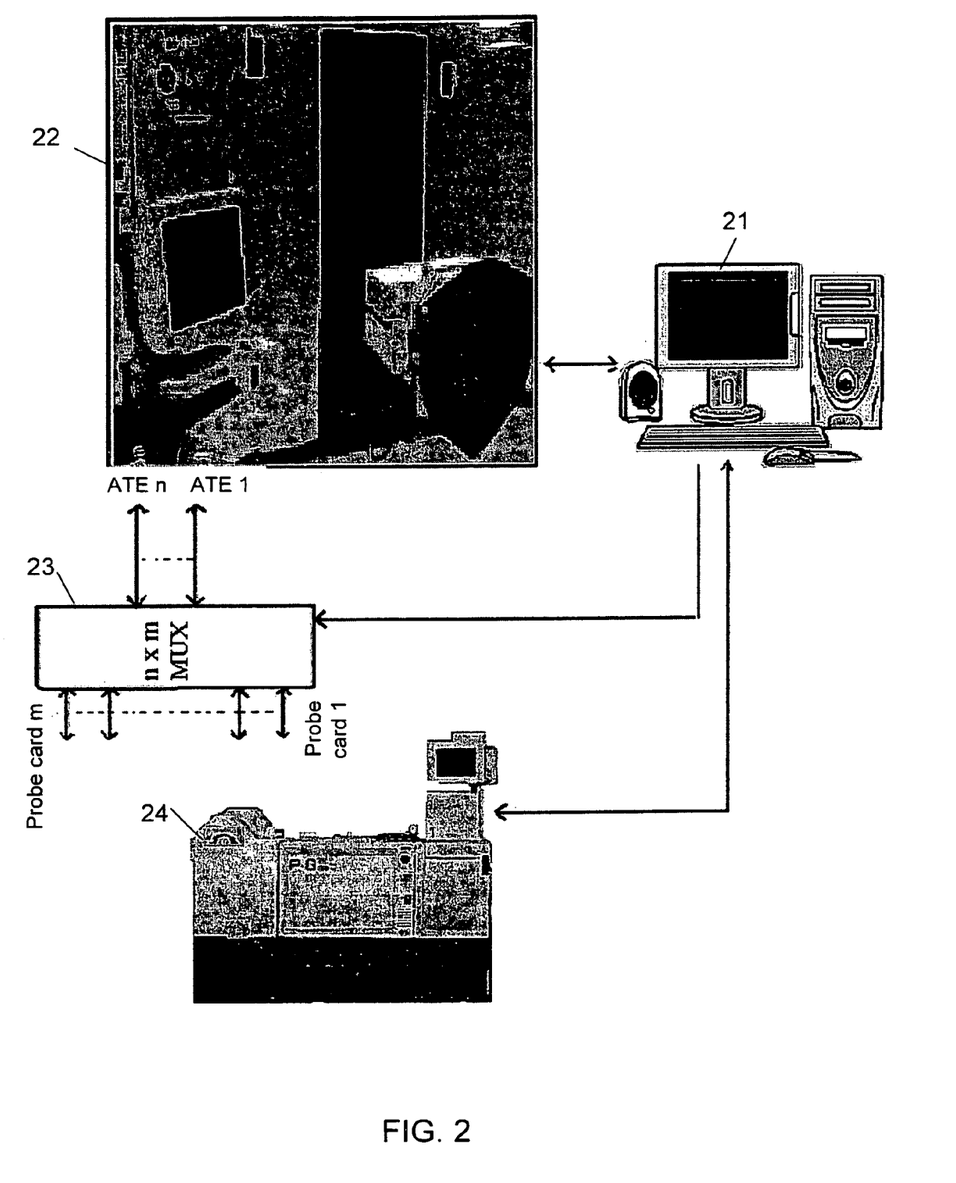
FIG. 2—illustrates a high level block diagram of an embodiment of the present invention.

Referring to FIG. 2, an embodiment of the present invention is illustrated. A station controller computer (21), is capable of managing, controlling and executing the IC testing process, as will be elaborated in further detail with reference to FIG. 4 below.

In accordance with certain embodiments, the station controller controls the ATE interface (22), using, e.g., IEEE industry standards protocols for test equipment such as GPIB and/or SECS-GEM.

In accordance with certain embodiments, the station controller is used:

1. To interact with the fab, etest, sort databases to verify that the lot is healthy as will be explained with reference FIG. 4.

2. To store process and product databases which will allow on-the-fly calculation of optimized test sites location and application of the testing scheme (including sequence and content) as will be explained in FIGS. 5–6.

3. Direct the n by m test multiplexer to connect each test site to the appropriate test location.

Figure 4:
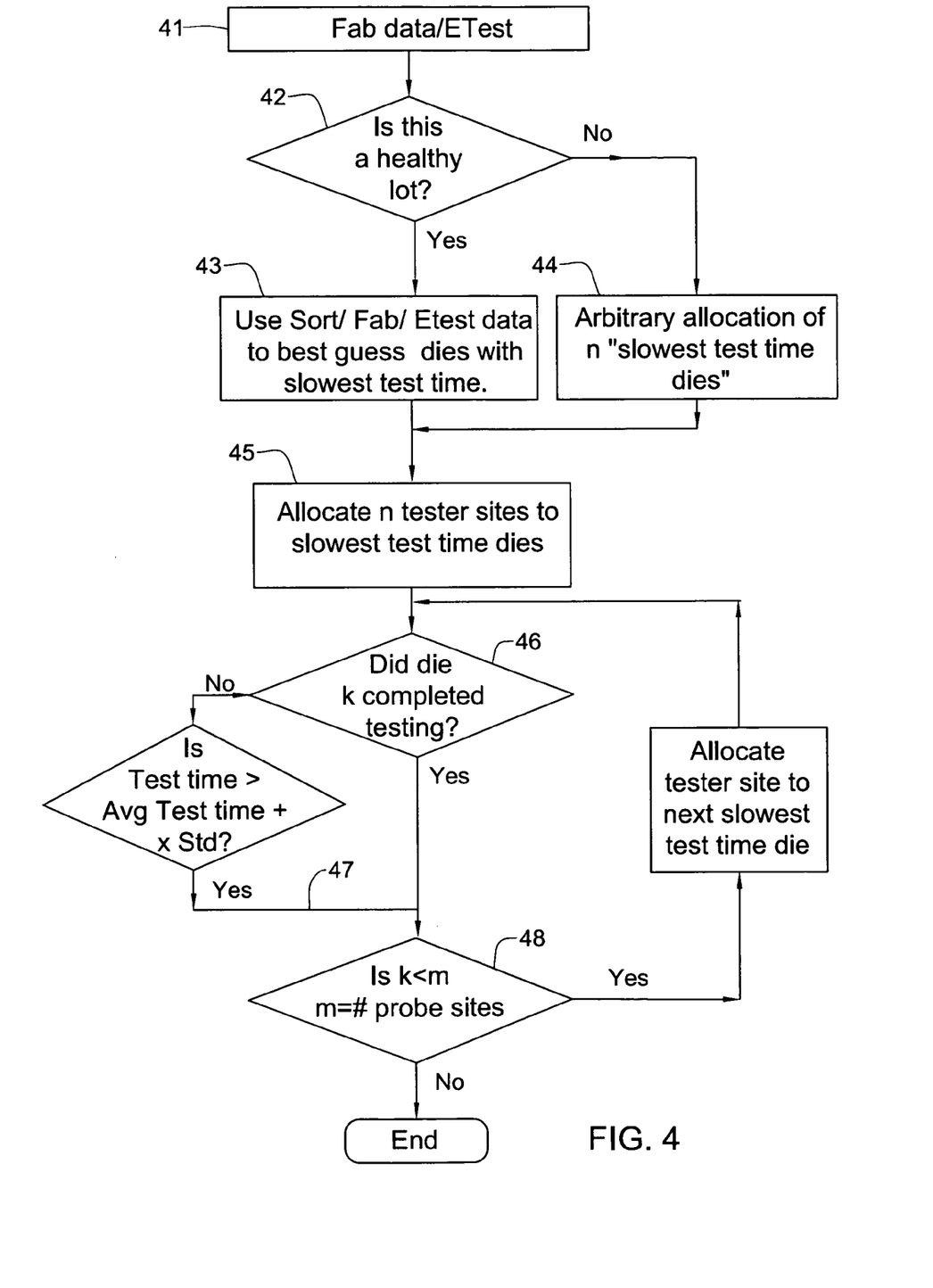
FIG. 4—is a flow diagram of an optimization method, in accordance with an embodiment of the invention.

In operation, the station controller selects (e.g., in accordance with the flow diagram described with reference to FIG. 4, below), the appropriate probe card site and allocates tester resources (i.e., the test sites in the ATE). A multiplexer (23) is interposed in between the n tester sites (22) and the m>n probe card sites (24) allowing logical stepping. The stepping is referred to as logical, since there is no mechanical movement of the probes, but rather allocation of an ATE test site (e.g., processing resource) to a given probe location, all as explained in greater detail below. The multiplexer will not degrade the testing quality with respect to voltage-current characteristics, frequency response, off-state leakage and similar attributes.

Note that the invention is not bound by the generalized system architecture and operation as depicted in FIG. 2.

Figure 3:
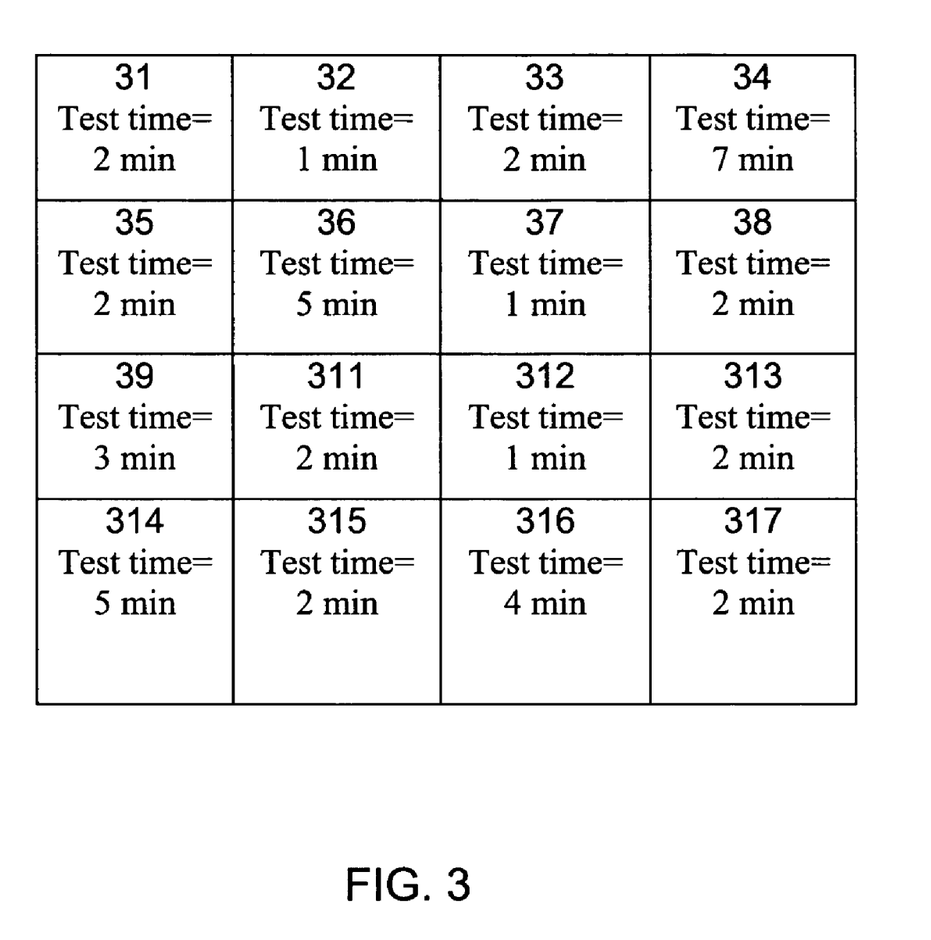
FIG. 3—illustrates a test time example, in accordance with an embodiment of the invention.

Referring now to FIG. 3, in order to explain further the concept of certain embodiments of the invention, a simple example is depicted. In this particular example, 16 dies (constituting a "simplified" wafer) are being tested simultaneously "simulating" a situation of most updated technology, namely n, tester site=m, probe site=16. Test time will be determined by the slowest die (34) and testing will be completed in 7 min.

Considering now a scenario in which the invention is applied to a previous generation of ATE supporting 4 testing sites (n=4) and a newer probe card technology, supporting the specified 16 probe sites (m=16).

In this case, 4 dies are being tested simultaneously, allowing lower parallelism of only 4 sites (compared to simultaneous 16 tested sited in the ideal situation of n=m=16).

Before describing certain embodiments of the invention, there follows a description of testing the simplified wafer of FIG. 3, using an unoptimized approach (before upgrade), where n=m=4, or in other words the older generation of ATE and probe card is used.

In accordance with this approach, in order to test the entire 16 sites of the "simplified" wafer, four quartiles are tested serially. Thus, in the first phase the four test sites will be allocated to the probe sites that are applied to dies 31, 32, 34 and 36 of the $1^{st}$ quartile. The test time of the $1^{st}$ quartile will be determined by the slowest test 36 (5 minutes). Having completed the test of the $1^{st}$ quartile, the four test sites will be allocated to the probe sites that are applied to the dies of the $2^{nd}$ quartile (i.e., dies 33,34, 37 and 38). This would obviously require mechanically moving the probe card and applying a touchdown of the probe sites to the dies of the $2^{nd}$ quartile.

The test time of the $2^{nd}$ quartile will be determined by the slowest test 34 (7 minutes). After having completed the test of the $2^{nd}$ quartile, the $3^{rd}$ quartile will be tested (requiring yet an additional touchdown of the probe sites to the dies of the $3^{rd}$ quartile) with a total test time of the slowest die 314 (5 minutes) and thereafter the $4^{th}$ quartile will be tested (obviously involving another touchdown) with a total test time of the slowest die 316 (4 minutes).

Accordingly, the overall test time will be composed of the test time of each quartile and the time required for the mechanical movement of three distinct touchdowns of the probe card, giving rise to more than 21 minutes of total test time. The total time to test the entire wafer is three times longer than the ideal case of n=m=16. Whilst the latter approach (n=m=4) affords the use of an older generation of ATE and probe card, this is at the undue penalty of extending drastically the testing duration (from 7 minutes to over 21 minutes), which, in many cases is not commercially feasible, bearing in mind the high price tag associated with each minute of testing.

In hitherto known technology, all dies are tested in the same manner so the penalty for using a previous generation of both ATE and probe card adversely affects the productivity, and therefore, in order to improve parallelism, test houses are driven to purchase new ATEs and probe cards to maintain their competitive edge, notwithstanding the very high price tag associated with such an upgrade. This is clearly evident from the simplified example above, where use of an older generation of ATE and probe card (supporting 4×4 sites) require 21 minutes overall testing time compared to 7 minutes with the newer generation of ATE and probe card (supporting 16 sites). Detailed elaboration follows explaining use of the invention in accordance with certain embodiments to provide efficient testing when upgrading only the probe card whilst maintaining the older generation of ATEs, thereby obviating or postponing the costly tester upgrades.

site. The actual implementation would involve providing a command from Station 21 to Mux 23 to assign the resources of the test site to die 35. Next, dies 31 and 33 will complete their testing after 2 minutes and the logical stepping of the resources will lead to assigning the resources to the next-in-line dies 36 and 37. As before, the allocation of test site resources to the probe sites that are contacting dies 36 and 37 is made in response to an appropriate command sent from Station 21 to Multiplexer 23.

This crawling process of reallocating tester resources will continue until the completion of the testing of all 16 dies and will require a total of 12 minutes, representing a net savings of 9 minutes test time (43% saving).

This crawling process of reallocating tester resources is demonstrated in the following table. The rows represent the 4 testing sites or CPUs. The columns represent the test time. As explained above, the station controller will allocate the tester CPUs arbitrarily to the first row. As shown, after the $1^{st}$ min, Die 32 will complete testing and the station controller will logically step the tester CPU to next die (35). This logical stepping will continue until the completion of testing of all dies at the 16 probe sites.

|     | min |    |    |    |    |    |    |    |    |    |    |    |
| --- | --- | -- | -- | -- | -- | -- | -- | -- | -- | -- | -- | -- |
| CPU | 1   | 2  | 3  | 4  | 5  | 6  | 7  | 8  | 9  | 10 | 11 | 12 |
| 1   | 31  | 31 | 36 | 36 | 36 | 36 | 36 | 313| 313| 317| 317|    |
| 2   | 32  | 35 | 35 | 38 | 38 | 311| 311| 314| 314| 314| 314| 314|
| 3   | 33  | 33 | 37 | 39 | 39 | 39 | 312| 315| 315|    |    |    |
| 4   | 34  | 34 | 34 | 34 | 34 | 34 | 34 | 316| 316| 316| 316|    |

In accordance with certain embodiments of the invention, the testing of dies for the case that $2*n \leq m$ (e.g., in the example of n=4 and m=16) can be optimized so as to reduce the overall test duration, thereby rendering the overall test procedure using older generation ATE and advanced probe card, commercially feasible. In accordance with certain embodiments of the invention, this can be implemented by allocating test sites to individual die through logical stepping, as will be explained in greater detail below.

The immediate advantage would be significant reduction of costs, since the testing procedure can be implemented using older generation of ATE with newer generation of probe card (n>m), and the need (and pertinent associated high price tag) of upgrading both the probe card and the ATE is postponed if not obviated. Bearing in mind that a typical FAB employs dozens of testers, the possibility to achieve significant improvement in test time, whilst upgrading only the probe cards, constitutes significant commercial advantage.

In accordance with certain embodiments of the invention, the allocation of a test site to individual die is performed using a simple crawling algorithm. The simple crawling algorithm will be first exemplified with reference to FIG. 3. This approach can be used, for example, when there is no ability to predict test time.

At the onset, the probe card is applied in a single touchdown to the entire 16 sites. The first 4 dies to be tested are arbitrarily selected, say dies 31, 32, 33 and 34, and are then assigned tester resources (test sites).

Die 32 will complete its testing in 1 minute and the station controller will move the tester resources (e.g., the processor resources of the vacant test site) to the next-in-line die 35 (crawling). This constitutes a logical stepping, since there is no mechanical movement involved, but rather merely allocation of the computational resources to a different probe Moreover, note by this specific example (m=16), that a single touchdown encompassed all 16 dies, compared to four distinct touchdowns each encompassing each 4 dies (when m=4), eliminating thus three mechanical moves and 3 touchdowns. Thus, not only is test time saved, but also mechanical movements of the probe card are reduced, thereby extending the life span of the probe card, thereby further reducing costs.

Note that, whereas the crawling embodiment illustrated, is serial crawling in which the next-in-line die is selected (in the latter example die 35, and then 36 etc.), this is by no means binding. Thus, in accordance with certain other embodiments, a different order of die can be selected, and in fact any arbitrarily selected order is applicable.

In accordance with certain other embodiments, a so-called smart allocation is utilized for implementing testing in n<m environment. In accordance with certain embodiments, the smart allocation is based on selecting devices with slowest estimated test time from among the estimated test time of the tested devices. The selection of additional devices for testing is based on testing time in a descending order, as will be exemplified in greater detail below.

Thus, (with reference also to FIG. 3) if the dies can be grouped according to their expected test time, starting from the longer test time and processing in a descending order, then dies 34, 36, 314 and 317 will be tested together and will be the first ones to be tested. Upon the completion of the fastest test from among the four tested dies (316—4 minutes), the tester resources will be allocated to the next slowest die (39—3 minutes) and this allocation of tester resources by the slowest die will continue (each time testing the next slowest die) until the completion of the testing of all 16 dies. Test time will be further reduced to 11 minutes representing a saving of 10 minutes, or 47% saving). The saving of mechanical movement and the elimination of the touchdowns are the same for this further improvement. This is demonstrated in the following table.

|  | min | | | | | | | | | | | |
|---|---|---|---|---|---|---|---|---|---|---|---|---|
| CPU | 1 | 2 | 3 | 4 | 5 | 6 | 7 | 8 | 9 | 10 | 11 | 12 |
| 1 | 34 | 34 | 34 | 34 | 34 | 34 | 34 | 35 | 35 | 315 | 315 | |
| 2 | 36 | 36 | 36 | 36 | 36 | 31 | 31 | 38 | 38 | 317 | 317 | |
| 3 | 314 | 314 | 314 | 314 | 314 | 33 | 33 | 311 | 311 | 32 | 312 | |
| 4 | 316 | 316 | 316 | 316 | 39 | 39 | 39 | 313 | 313 | 37 | | |

Figure 5:
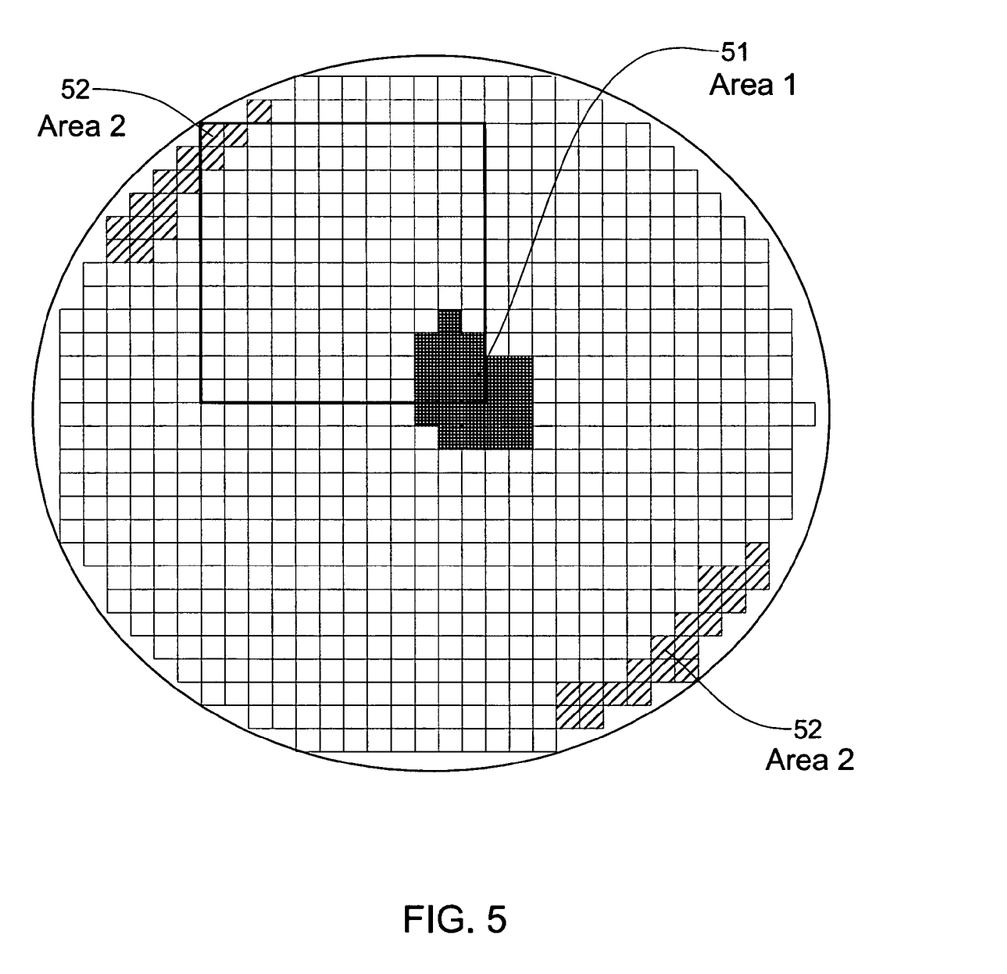
FIG. 5—illustrates a wafer map example, in accordance with an embodiment of the invention.
Figure 6:
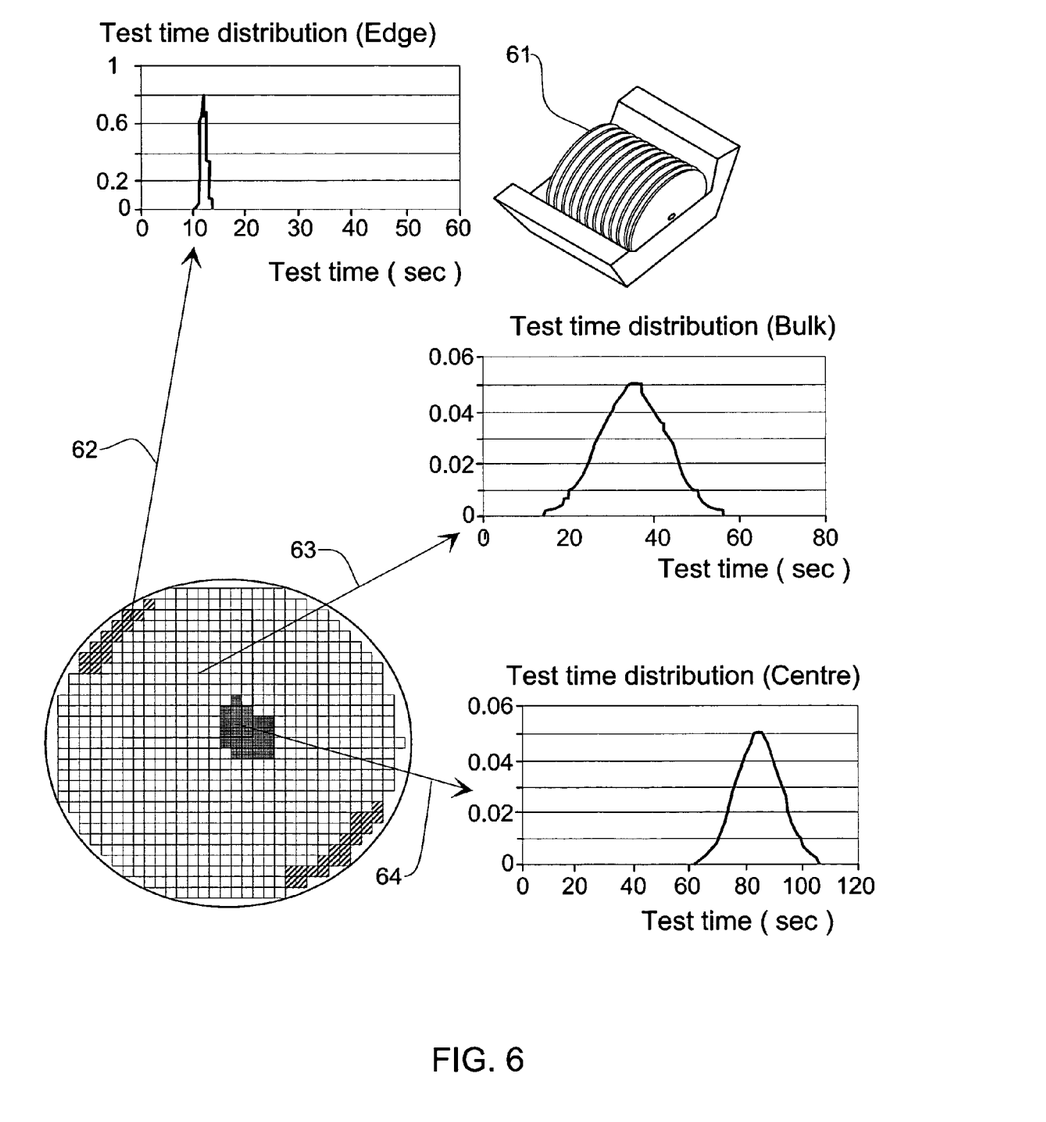
FIG. 6—illustrates test time statistics for the example of FIG. 5.
Figure 7:
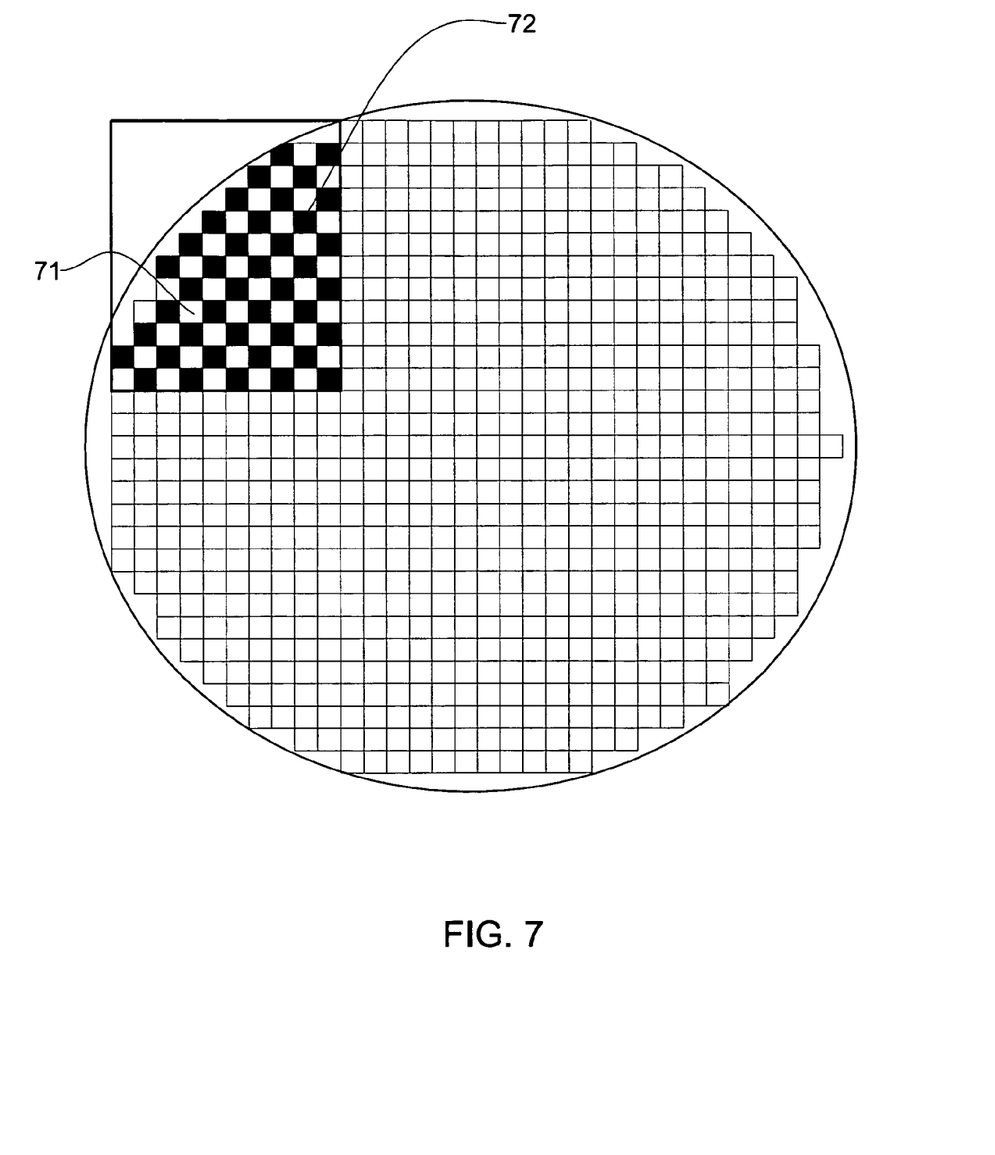
FIG. 7—illustrates a parametric test example, in accordance with an embodiment of the invention.

In accordance with certain embodiments of the smart allocation, the determination of slowest devices is determined by collecting statistics, as will exemplified in greater detail below, with reference to FIGS. 5–7. Before exemplifying certain embodiments which utilize statistics analysis to predict testing time, attention is drawn to FIG. 4 illustrating a flow diagram of an optimization method, in accordance with an embodiment of the invention. At the onset, fab and etest data is received (41) and lot health is checked (42). As is well known, a healthy lot is a standard lot, i.e., it was not involved in an excursion such as misprocessing during fabrication and/or no engineering experimentation was done. In the case of an unhealthy lot, statistical information on test times, such as within-lot standard deviation or die-to-die standard deviation, may be invalid.

In the case of a healthy lot, the stored database (43) of historical information as well as various test time distributions (such as mean and standard deviation of the product, mean and standard deviation within wafer, touchdown-to-touchdown distribution or the distribution of all x-y locations in a lot), the station controller will calculate (45) the n locations with the estimated slowest test time to begin testing. This is further explained in FIGS. 5 to 7, below. If these locations cannot be calculated (unhealthy lot which is not valid or there is a failure to predict), the station controller will allocate arbitrarily n such locations (44). Examples of failure to predict are locations which, based on the analysis of history (as described herein), have a given estimated testing time, but in real-life it turns out that the elapsed testing time is considerably larger.

Assuming healthy lots, the station controller will track the individual test time for each die (46) and upon completion, will allocate the tester resources to the next probe site until the completion of all probing sites (48), in accordance with the scheme described with reference to FIG. 3. If the test time exceeds an average TTG—test time good plus x standard deviation (47) (e.g., x=3 but it can be, of course, selected differently defined by the user), then die testing is terminated and the die is marked as a "fail". Obviously, the termination occurs before the testing session has been completed for this particular die. In the context of the this exemplifies, in a non-limiting manner, a so called "tail invention, cut off" procedure being another example of the so called smart allocation.

Having described non-limiting example of a sequence of operation (with reference to FIG. 4), attention is drawn again to smart allocation. Thus, there follows a few additional non-limiting examples of gathering statistics based on historical tests, for predicting devices test time. The first example concerns sort-to-sort statistics and the second concerns the wafer map.

The sort-to-sort statistics gathering will be exemplified in the following example: A flash memory test flow typically includes two or three wafer sort stages, followed by a final package test. Wafer sort 1 is a memory test typically involving writing checkerboard or diagonal patterns to test array programming. Wafer sort 1 concludes by programming a pattern in memory for the subsequent data retention stress (a high temperature bake between sort 1 and sort 2). Wafer sort 2 retests logic and memory, verifying the data programmed at the conclusion of wafer sort 1. It is assumed in accordance with this example, that FIG. 3 represent both sort 1 and sort 2. However, devices 32 and 35 are actually failed dies from sort 1 that do not require sort 2. Sort 1 will be done based on simple crawling as explained above, consuming 12 minutes. The statistics here gathered the vital information that devices 32 and 35 should not be tested at all at sort 2. Accordingly, sort 2 will be skipped for these failed dies, resulting in minimal test time of 10 minutes, as demonstrated in the table:

|  | min | | | | | | | | | | | |
|---|---|---|---|---|---|---|---|---|---|---|---|---|
| CPU | 1 | 2 | 3 | 4 | 5 | 6 | 7 | 8 | 9 | 10 | 11 | 12 |
| 1 | 34 | 34 | 34 | 34 | 34 | 34 | 34 | 39 | 39 | 39 | | |
| 2 | 36 | 36 | 36 | 36 | 36 | 31 | 31 | 33 | 33 | 37 | | |
| 3 | 314 | 314 | 314 | 314 | 314 | 38 | 38 | 311 | 311 | 312 | | |
| 4 | 316 | 316 | 316 | 316 | 315 | 315 | 317 | 317 | 313 | 313 | | |

Turning now to another example of gathering statistics, Test time statistics can be correlated with wafer maps. In the case of the example of FIG. 5, 144 dies are probed in parallel and there are 36 test sites. The 3 edge dies, marked by a cross-hatched pattern (in area 52), typically fail after a short time and the 7 centre dies (in area 51), marked with a checkered pattern, are typically slow to test. More details are given in FIG. 6. A lot of 25 wafers (61) are shown. The test time average of the 3 edge dies in a wafer is 12 sec with a very tight distribution (62). The test duration of 7 center dies in a wafer is 85 sec with standard deviation of 8 sec (64). The bulk of the dies (63) (134 dies) will have a wide distribution around 35 sec. This is just one of the possible statistics to be collected. Based on the specified statistics, the 7 center dies will be grouped together and will be tested first (since their test duration is the slowest), together with 29 dies that belong to the bulk of the dies, constituting together 36 simultaneous tested devices. The 29 dies will finish test after about 35 seconds and tester resources will be released for further usage, namely for additional dies that belong to the "bulk" category. This procedure (of picking the next slowest die for testing) will continue until all 144 dies are tested. By this approach, the 3 edge dies will be the last to be tested. Based on yield vs. test time optimization, it might be beneficial to mark slow test time dies or few remaining dies as failures and allow logical or mechanical stepping.

Note that statistics gathering is not bound by the sort-to-sort, or wafer map examples given here. In accordance with certain other embodiments, the statistics gathering can be used to evaluate within-touchdown average, product based statistics, or any test time statistics that can be collected and used for prediction and smart allocation of tester resources.

In accordance with certain other embodiments, the smart allocation involves a so-called selected testing policy not necessarily based on gathering historical statistics. Thus, in accordance with certain embodiments, a so-called parametric testing is employed, which is applied selectively to distinct dies. After having applied parametric testing to distinct dies, in accordance with certain embodiments, the smart allocation involves selecting dies according to slowest test time in a descending order, as explained in detail above.

More specifically, and as is generally known per se, parametric testing in wafer sort (not in etest) such as the device max frequency (Fmax) or Iddq measurement is done today on all dies and on all wafers, regardless of previous etest data or on-the-fly wafer sort measurement results. Parametric test data is used for "cherry picking" (i.e., sorting the good dies by their max frequency, reliability and process control. However, unlike functional failures, parametric variation is typically a slow changing function of wafer coordinates, thus allowing for interpolation and its calculation based on-the-fly measurements and historical process knowledge. This may have a significant test time impact.

Bearing this background in mind, in this example (FIG. 7) a checkerboard pattern is used. Devices located on the white squares (71) are measured, while device located on the black square are skipped, and Fmax is calculated based on the measurement of the four neighboring dies. This will lead to a significant test time reduction depending on the number and duration of parametric tests. In this example, dies that are subject to parametric testing (such as undergoing an Iddq test) will be grouped together and tested first (since that, due to the extra test, the later dies has longer test time) following dies where parametric testing is skipped Those versed in the art will readily appreciate that the invention is not bound by the specified parametric tests and a fortiori not by the use of Iddq test and the utilization of the specific checkerboard pattern.

In accordance with certain embodiments, a combination of two or more of the specified smart selection techniques can be used, e.g., tail cut-off and sort-to-sort statistics. It will also be understood that the system, according to the invention, may be a suitably programmed computer. Likewise, the invention contemplates a computer program being readable by a computer for executing the method of the invention. The invention further contemplates a machine-readable memory tangibly embodying a program of instructions executable by the machine for executing the method of the invention.

The present invention has been described with a certain degree of particularity, but those versed in the art will readily appreciate that various alterations and modifications may be carried out, without departing from the scope of the following Claims.

The invention claimed is:

1. A method for testing a plurality of devices in parallel, comprising:
   a) allocating n test sites;
   b) in a given test operation, allocating m connection sites, such that n<m and associating m devices of a tested object to the m connection sites;
   c) in said given test operation, using gathered statistics of historical testing including at least one previous wafer sort operation for identifying at least one failed device from among said m devices;
   d) in said given test operation, applying simultaneously a testing scheme to at most n devices from among the m devices; the up to n devices constitute tested devices and do not include any of said at least one failed device;
   e) in said given test operation repeatedly performing the following until all said m devices are handled:
      i. in response to termination of testing of a device, selecting for test at least one untested device from among the m devices by allocating thereto a respective vacant test site; said untested device is not any of said at least one failed device and is selected using a criterion for reducing the overall testing time of the m devices compared to overall time it would take to test the m devices using up to n connection sites.

2. The method according to claim 1, wherein the device is a die in a wafer.

3. The method according to claim 2, wherein the die is a memory die.

4. The method according to claim 2, wherein the die a processor die.

5. The method according to claim 2, wherein said m connection sites are probe sites.

6. The method according to claim 1, wherein said device is a packaged device.

7. The method according to claim 6, wherein said m connection sites are handler sites.

8. The method according to claim 1, wherein the device is a module in a multi-core device.

9. The method according to claim 1, wherein said selecting comprises crawling to next untested device from among the m devices.

10. The method according to claim 9, wherein said crawling comprises a simple serial crawling for selecting the next untested device.

11. The method according to claim 9, wherein said crawling comprises arbitrary crawling for selecting arbitrarily the next-untested device.

12. The method according to claim 9, wherein said testing scheme includes n devices and wherein said selecting for test is applied to one added device at a time and wherein a vacant test site is allocated to said added device.

13. The method according to claim 2, wherein the up to n devices are selected according to slowest estimated test time from among the estimated test time of said m devices, and wherein said criterion comprises selecting a untested device having slowest estimated test time compared to estimated test time of remaining untested devices.

14. The method according to claim 1, wherein said selection includes smart selection of next untested device.

15. The method according to claim 14, wherein said criterion comprises selecting an untested device having slowest estimated test time compared to estimated test time of remaining untested devices.

16. The method according to claim 14, wherein said smart selection includes applying predefined testing to selected devices.

17. The method according to claim 16, wherein said selected devices comply with checkerboard pattern.

18. The method according to claim 16, wherein said predefined testing comprises parametric testing of selected device.

19. The method according to claim 1, further comprising a preliminary step of gathering statistics of historical testing including at least one previous wafer sort operation for identifying said at least one failed device.

20. A system for testing a plurality of devices in parallel, comprising:
   a control capable of being coupled to a tester and multiplexer;
   the tester is configured to allocate testing resources of n test sites;
   the multiplexer is configured to be coupled to the tester and a connector;
   the connector is configured, in a given test operation, to allocate m connection sites, and to associate m devices of a tested object to the m connection sites, such that n<m;
   the control is further configured, in said given test operation, to use gathered statistics of historical testing including at least one previous wafer sort operation for identifying at least one failed device from among said m devices;
   the control is further configured, in said given test operation, to allocate at most n devices from among the m devices to corresponding at most n connection sites, the up to n devices do not include any of said at least one failed device; said control is further configured to apply simultaneously a testing scheme to the at most n devices; and
   said controller is further configured, in said given test operation, to repeatedly perform the following until all said m devices are handled: in response to termination of testing of a device, selecting for test at least one untested device from among the m devices by allocating thereto, through said multiplexer, a respective vacant test site in the tester; said untested device is not any of said at least one failed device and is selected using a criterion for reducing the overall testing time of the m devices compared to overall time it would take to test the m devices using up to n connection sites.

21. A computer program product having storage for storing computer code portions for performing at least the following:
   a) allocating n test sites;
   b) in a given test operation, allocating m connection sites, such that, n<m and associating m devices of a tested object to the m connection sites;
   c) in said given test operation, using gathered statistics of historical testing including at least one previous wafer sort operation for identifying at least one failed device from among said m devices;
   d) in said given test operation, applying simultaneously a testing scheme to at most n devices from among the m devices; the up to n devices constitute tested devices and do not include any of said at least one failed device;
   e) in said given test operation repeatedly performing the following until all said m devices are handled:
   in response to termination of testing of a device, selecting for test at least one untested device from among the m devices by allocating thereto a respective vacant test site; said untested device is not any of said at least one failed device and is selected using a criterion for reducing the overall testing time of the m devices compared to overall time it would take to test the m devices using up to n connection sites.

* * * * *